United States Patent
MacBeth

Patent Number: 5,982,230
Date of Patent: Nov. 9, 1999

[54] AMPLIFIER CIRCUIT

[75] Inventor: Ian MacBeth, Holmeschapel, United Kingdom

[73] Assignee: Motorola, Inc., Schaumburg, Ill.

[21] Appl. No.: 09/029,548

[22] PCT Filed: Sep. 6, 1996

[86] PCT No.: PCT/GB96/02217

§ 371 Date: Jul. 30, 1998

§ 102(e) Date: Jul. 30, 1998

[87] PCT Pub. No.: WO97/09779

PCT Pub. Date: Mar. 13, 1997

[30] Foreign Application Priority Data

Sep. 7, 1995 [GB] United Kingdom .................. 9518306

[51] Int. Cl.[6] .................................................. H03F 1/02
[52] U.S. Cl. ................................ 330/9; 330/69; 330/258
[58] Field of Search ............................. 330/69, 124 R, 330/51, 9, 253, 252, 258

[56] References Cited

U.S. PATENT DOCUMENTS

| | | | |
|---|---|---|---|
| 3,725,818 | 4/1973 | Nurmohamed et al. | 330/124 D |
| 4,797,631 | 1/1989 | Hsu et al. | 330/253 |
| 5,325,069 | 6/1994 | Sundby | 330/253 |
| 5,808,513 | 9/1998 | Archer | 330/253 |

*Primary Examiner*—Robert Pascal
*Assistant Examiner*—Henry Choe
*Attorney, Agent, or Firm*—Rennie W. Dover

[57] ABSTRACT

An amplifier circuit having a programmable configuration which is selectable by a user. The amplifier circuit includes a pair of two-input differential input circuits. Each two-input differential input circuit has first and second input terminals, wherein the first input terminal of the first two-input differential circuit is connected to a first circuit input and the first input terminal of the second two-input differential circuit is connected to a second circuit input. The amplifier also includes programmable circuitry for selectively connecting the second input terminals of the first and second two-input differential circuits to either second or third circuit inputs, respectively, or to the fourth and first input terminals, respectively.

31 Claims, 4 Drawing Sheets

AMPLIFIER CIRCUIT

The present invention relates to an amplifier circuit having a programmable configuration, and more particularly, but not exclusively, to such an amplifier circuit whose configuration is selectable at will by a user. The invention also relates to a method of applying inputs to an amplifier.

BACKGROUND OF THE INVENTION

In the past, analog signal processing circuits have been provided by discrete components. In such arrangements the topology of the circuit and the values of the components to be chosen at the outset have to be "correct" for the particular application. Such circuits have a disadvantage that where changes in circuit requirements occur, it may be difficult to reconfigure the circuit to have a different topology.

More recently, analog integrated circuits have been provided. Such circuits aim to include many or all of the required integers within the integrated circuit. However, the cost of making an integrated circuit for each different possible application would be prohibitive, and accordingly it has become known to provide multi-purpose analog integrated circuits otherwise known as integrated circuit analog systems which have circuit portions which can be selectively enabled or disabled to customize the circuit for a particular application, and which have circuit elements which can be programmed to provide, for example, a desired impedance.

SUMMARY OF THE INVENTION

In a known integrated circuit analog system, an array of configurable analog cells, capable of interconnection with other cells of the array, can be individually configured to set various programmable resistors and capacitors in the cells to desired values. The setting circuitry includes amplifiers whose configuration is desirably programmable.

An embodiment of the present invention provides an amplifier circuit suitable for use in integrated circuit analog systems, and having just such a programmable configuration.

According to a first aspect of the present invention there is provided an amplifier circuit comprising a first and a second two-input differential input circuit, the first differential input circuit having first and second input terminals and a second differential input circuit having third and fourth input terminals, the first input terminal being connected to a first circuit input, the fourth input terminal being connected to a fourth circuit input, and programmable circuitry for selectively connecting the second and third input terminals either to second and third circuit inputs respectively, or to the fourth and first input terminals respectively.

According to a second aspect of the present invention there is provided an amplifier circuit comprising a first and a second two-input differential input circuit, the first differential input circuit having first and second input terminals and a second differential input circuit having third and fourth input terminals, the first input terminal being connected to a first circuit input, the fourth input terminal being connected to a fourth circuit input, and programmable circuitry for selectively connecting the second and third input terminals either to second and third circuit inputs respectively, or to the fourth and first circuit inputs respectively or both to a fifth circuit input.

Preferably the first differential input circuit comprises first and second amplifying elements, and the second differential input circuit comprises third and fourth amplifying elements, each said amplifying element having a respective main current path and a control terminal connected to the respective input terminal.

Conveniently each main current path is defined by a pair of main current electrodes, one main current electrode of the first amplifying element and the corresponding main current electrode of the second amplifying element forming a first node, and one main current electrode of the third amplifying element and the corresponding main current electrode of the fourth amplifying element forming a second node.

Preferably the amplifier circuit further comprises connecting circuitry for selectively connecting the first and second nodes together.

Advantageously the amplifier circuit has first bias circuitry for providing a first current path from the first node to a reference potential and for providing a second current path from the second node to the reference potential.

Conveniently, the amplifier circuit comprises first and second transimpedance circuitry, the first transimpedance circuitry being responsive to the currents in the main current paths of the first and second amplifying elements, and the second transimpedance circuitry being responsive to the currents in the main current paths of the third and fourth amplifying elements.

Advantageously the first and second transimpedance circuitry comprise current mirror circuitry.

Conveniently the first and second transimpedance circuitry comprise folded cascode circuitry.

Preferably the first and second transimpedance circuitry comprise respective first and second controllable offset circuitry and mode selection circuitry for selective connection of a control terminal of the controllable offset circuitry of one transimpedance circuitry to the output of the other transimpedance circuitry, whereby common mode output levels may be controlled.

Preferably the programmable circuitry has an input for a digital signal, whereby the connection of the control electrodes of the second and third amplifying elements is determined.

Alternatively the programmable circuitry is one-time programmable, whereby the connection of the control electrodes of the second and third amplifying elements is determined.

Preferably the first and fourth input terminals are inverting terminals and the second and third input terminals are non-inverting input terminals.

According to a third aspect of the present invention, there is provided an integrated circuit analog system comprising an amplifier circuit in accordance with the first or second aspects.

According to a fourth aspect of the present invention there is provided a method of supplying inputs to an amplifier circuit having first and second two-input differential input circuits, wherein the first differential input circuit has first and second input terminals and the second differential input circuit has third and fourth input terminals, comprising connecting a first circuit input to the first input terminal; connecting a fourth circuit input to the fourth input terminal; and selectively connecting the second and third input terminals either to second and third circuit inputs respectively, or to the fourth and first input terminals respectively.

BRIEF DESCRIPTION OF THE DRAWINGS

Embodiments of the present invention will now be described with reference to the accompanying drawings in which.

In the drawings, like reference numerals indicate like parts.

DETAILED DESCRIPTION OF THE DRAWINGS

Figure 1:
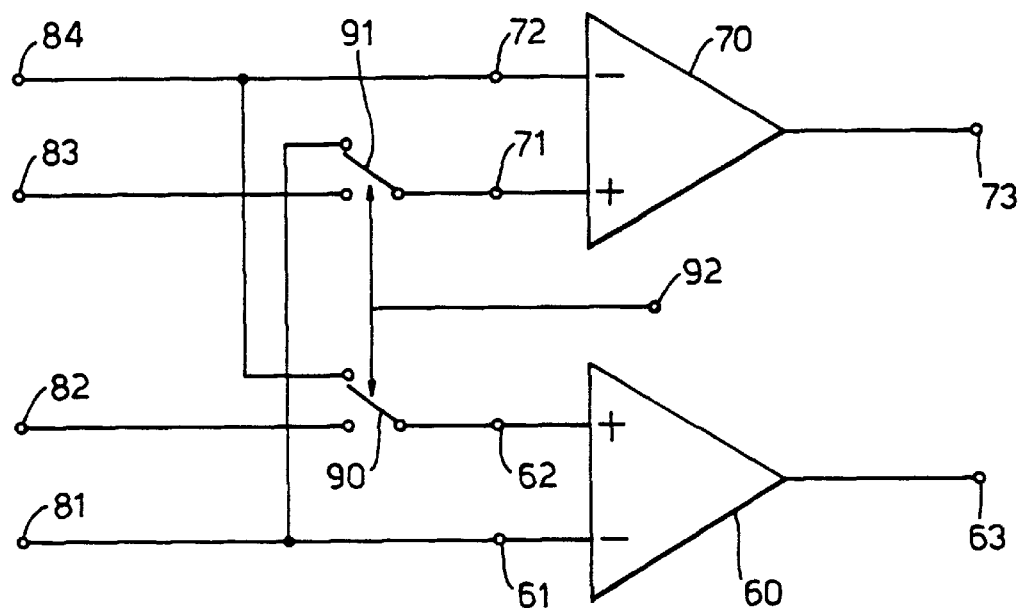
FIG. 1 shows a block diagram of a first embodiment of an amplifier circuit in accordance with the present invention.

Referring firstly to FIG. 1, a first differential amplifier (60) comprises a first differential input circuit, having first and second input terminals (61,62) and an output terminal (63). The output at the output terminal (63) is determined by the difference between the voltage at inverting terminal (62) and the voltage at non-inverting-input terminal (62). The circuit of FIG. 1 further consists of a second amplifier (70) comprising a second differential input circuit having third and fourth input terminals (71,72) and an output terminal (73). The voltage at the output terminal (73) is determined by the difference between the voltage at the non-inverting third input terminal (71) and the voltage at the fourth inverting input terminal (72). The circuit shown in FIG. 1 further has a first circuit input (81) connected to the first input terminal (61) of the first amplifier (60), a fourth input terminal (84) connected to the fourth input terminal (72) of the second amplifier (70). The circuit also has second and third input terminals (82,83) which may selectively be connected to the second input terminal (62) of the first amplifier (60) and the third input terminal (71) of the second amplifier (70), respectively, via switches (90,91). As shown in FIG. 1, switch (90) has a first position in which it connects the second circuit input (82) to the second input terminal (62) of the first amplifier (60), and a second position where the switch connects the fourth circuit input (84) to the second input terminal (62) of the amplifier (60). Similarly, the switch (91) has a first position in which it connects the third circuit input (83) to the third input terminal (71) of the second amplifier (70), and a second position in which the switch connects the first input terminal (81) to the third input terminal (71) of the second amplifier (70). The position of the switches (90,91) is programmable, and in FIG. 1 there is provided a digital control input terminal (92) for programming both the first and second switches (90,91) either to both be in their first position, or both be in their second position. Alternatively, the position of the switches (90,91) may be determined by other programmable means, such as for example by fusible links.

In the first position of the switches (90,91), the first and second circuit inputs (81,82) feed only the first amplifier (60) and the third and fourth circuit inputs (83,84) feed only the second amplifier (70). Thus, the amplifiers are mutually independent. For the second position of the switches (90,91) only two circuit inputs, first input (81) and fourth input (84) are "shared" among the two amplifiers (60,70). As the inputs are applied in opposite senses to the two amplifiers, the amplifier outputs, as apparent to one skilled in the art, will have mutually opposite signs. Hence in the second configuration, the circuit of FIG. 1 can provide a differential input, differential output amplifier.

Figure 2:
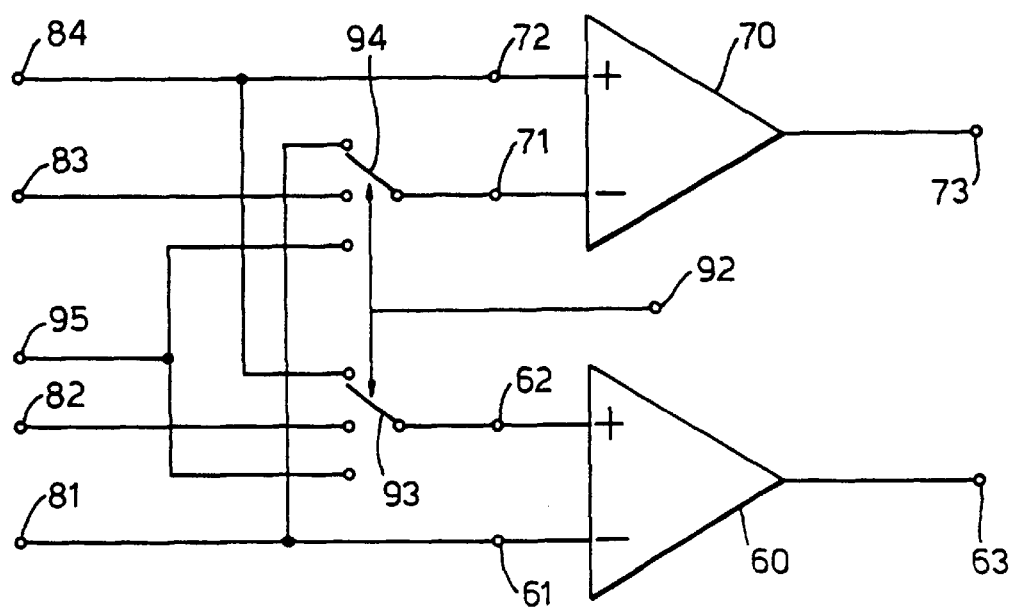
FIG. 2 shows a block diagram of a second embodiment of an amplifier circuit in accordance with the invention.

Referring now to FIG. 2, a second embodiment of the invention will now be described. Comparing with FIG. 1, it will be seen that the embodiment of FIG. 2 is substantially the same as FIG. 1 except that each of the switches has a third position in which the second input (62) of the first amplifier (60) and the third input (71) of the second amplifier (70) are connected to a fifth circuit input (95).

In the first two positions of operation of the switches (93,94), the circuit of FIG. 2 is operable in exactly the same way as previously described with respect to FIG. 1. However, in the third position of the switches (93,94), in which the second and third input terminals (62,71) are connected to the fifth circuit input (95), the output of the first amplifier (60), at output terminal (63) corresponds to a gain factor multiplied by the difference between the input voltage at first input terminal (81) and the voltage at the fifth input terminal (95) and the output of the second amplifier, at the second output terminal (73), corresponds to the gain factor multiplied by the difference between the voltage of the fourth circuit input (84) and the voltage at the fifth circuit input (95).

It will be understood that the designation of the input terminals of the first and second amplifiers (60,70) in FIGS. 1 and 2 is not intended to be limitative. In other embodiments of the invention, for example, the first input terminal (61) of either amplifier could be the inverting terminal, and the second input terminal (62) of either amplifier the non-inverting input terminal.

Input stages to amplifiers frequently use differential transistor pairs. Such a transistor pair may, for example, consist of two field effect transistors, two bipolar transistors or two compound transistors. Usually, the term "pair" implies substantial identity between the two transistors of the pair; however it is possible, where conditions so dictate, to use non-identical transistors, and the term "pair" as used herein includes this meaning.

For brevity, this description refers to field effect transistors and uses the terms drain, source and gate to designate the electrodes of such transistors. However, it is envisaged that bipolar transistors could be used instead of field effect transistors, in which event the bipolar transistor would be connected with a collector electrode corresponding to the described drain electrode, an emitter electrode corresponding to the described source electrode and a base electrode corresponding to the described gate electrode.

Figure 3:
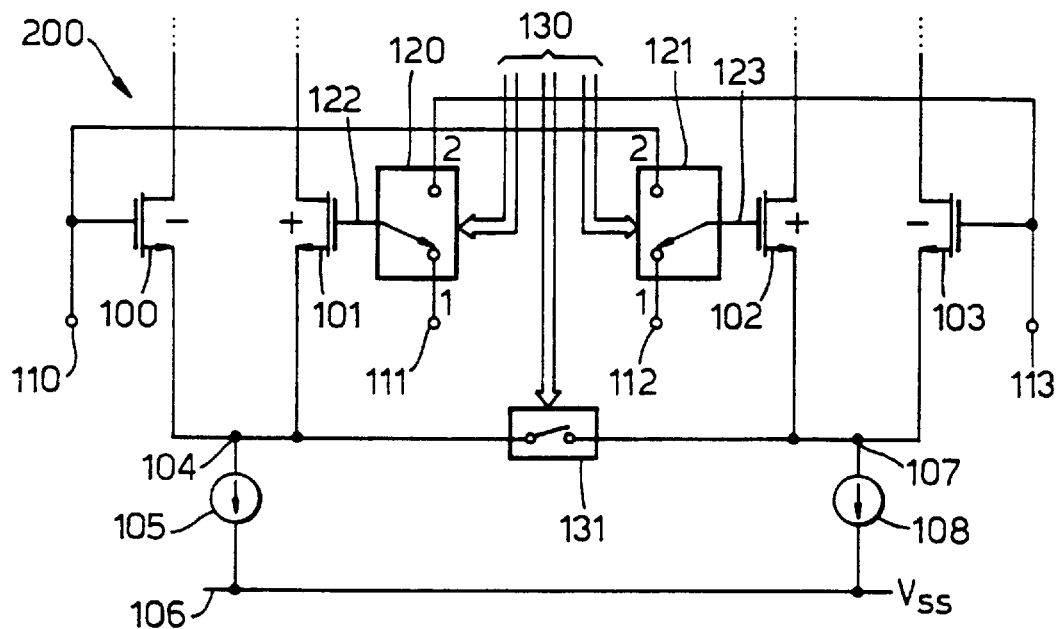
FIG. 3 shows a partial circuit diagram of a third embodiment of an amplifier circuit in accordance with the present invention.

Referring now to FIG. 3, an amplifier input circuit (200) of a third embodiment of an amplifier circuit in accordance with the present invention has transconductance circuitry comprising four transistors (100,101,102,103). Each of the transistors (100,101,102,103) has a gate electrode which is responsive to an applied voltage to control the flow of current in the channel between the drain and source. The source electrodes of the first and second transistors (100, 101) form a first common node (104), and a first current source (105) provides a first current path from the first common node (104) to a reference supply (106). The source electrodes of the third and fourth transistors, (102,103) form a second common node (107) and a second current source (108) provides a second current path from the second common node (107) to the reference potential (106). The input circuit has first to fourth input terminals, (110,111,112, 113). The first input terminal (110) is connected to the gate electrode of first transistor (100) and the fourth input terminal (113) is connected to the gate electrode of the fourth transistor (103). First selector circuitry (120) has one input connected to the second input terminal (111) and another input connected to the fourth. input terminal (113). The first selector circuitry (120) has an output (122) connected to the gate electrode of the second transistor (101), whereby the gate electrode of the second transistor (101) in operation selectively receives signals from the second input terminal (111) or the fourth input terminal (113). Likewise, second selector circuitry (121) has one input connected to the third input terminal (112) and another input connected to the first input terminal (110). The second selector circuitry (121) has an output (123) connected to the gate electrode of the third transistor (102), such that the gate of the third transistor (102) in operation receives signals from the third input terminal (112) or from the first input terminal (110).

The first and second selector circuitry (120,121) are responsive to applied digital control signals (130). This control signal acts on both selector circuitry so that they are switched in synchronism between their two inputs. Thus for a first digital control signal, the first selector circuitry (120) connects the second input terminal (111) to the gate electrode of the second transistor (101) and the second selector circuitry (121) connects the signal at the third input terminal (112) to the gate electrode of the third transistor (102). For a second digital control signal, the first selector circuitry connects the fourth input signal at fourth terminal (113) to the gate electrode of the second transistor (122) and the second selector circuitry (121) connects the first input signal at first terminal (110) to the gate electrode of third transistor (123).

Also shown in FIG. 3 is a connecting switch (131) which serves to selectively interconnect the first and second nodes (104,107) in response to the applied digital control signal (130). The connecting switch (131) is closed in response to the above-mentioned second digital control signal, and opened in response to the above-mentioned first digital signal.

The circuitry shown in FIG. 3, as mentioned above, serves generally to convert input voltages into currents. Further circuitry, (201,202) shown for example in FIG. 5, will be needed if it is desired to provide a voltage output. Other examples of this further circuitry, in the form of transimpedance circuitry can be derived from FIGS. 7–9. An advantageous form of the transimpedance circuitry will be later described with reference to FIG. 6.

Figure 4:
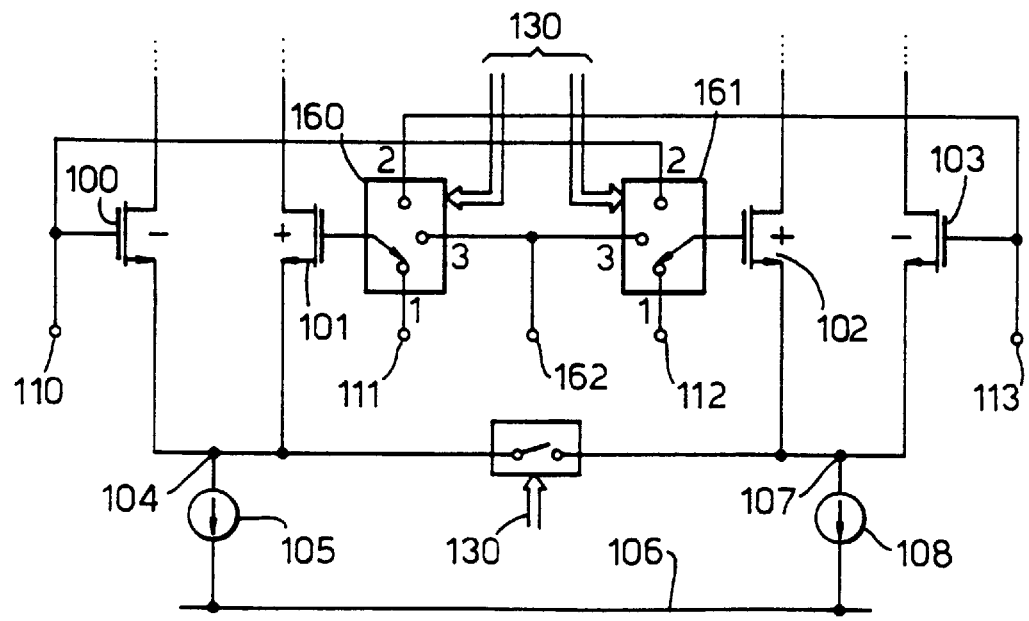
FIG. 4 shows a partial circuit diagram of a fourth embodiment of an amplifier circuit in accordance with the invention.

Turning now to FIG. 4, an amplifier input circuit of a further embodiment of an amplifier circuit in accordance with the invention is shown. The circuit of FIG. 4 is substantially similar to that described with respect to FIG. 3, except that the first and second selector circuitry (120,121) of FIG. 3 has only two selector inputs whereas the first and second selector circuitry (160,161) of FIG. 4 each have three selector inputs. The first two selector inputs are connected similarly to those described with respect to FIG. 3, and the third selector input is provided from a common input terminal (162). The first and second selector circuitry (160, 161) is digitally controllable similarly to the circuitry of FIG. 5, but responds to three digital control signals. In the same way as previously described, for a first digital control signal, the second input terminal (111) is connected to the gate of the second transistor (101) and the third input terminal (112) is connected to the third transistor (102), whereas for the second digital control signal, the fourth input terminal (113) is connected to the gate of the second transistor (101) and the first input terminal (110) is connected to the gate of the third transistor (102). For a third digital control signal, the gates of both the second and third transistors (101,102) are connected to the common fifth input terminal (162). The connecting switch (131) is responsive to the digital control signals such that in both the second and third digital states the first and second nodes (104,107) are connected in common.

Figure 5:
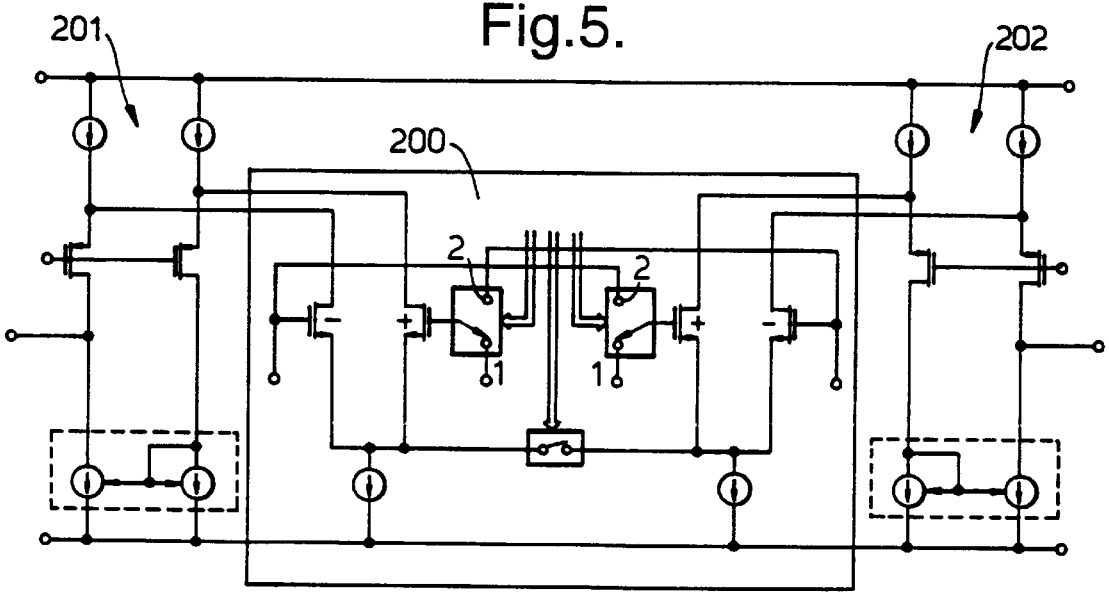
FIG. 5 shows the circuit of FIG. 3 supplemented with exemplary transimpedance circuitry to form a complete amplifier, or amplifier input stage.
Figure 7:
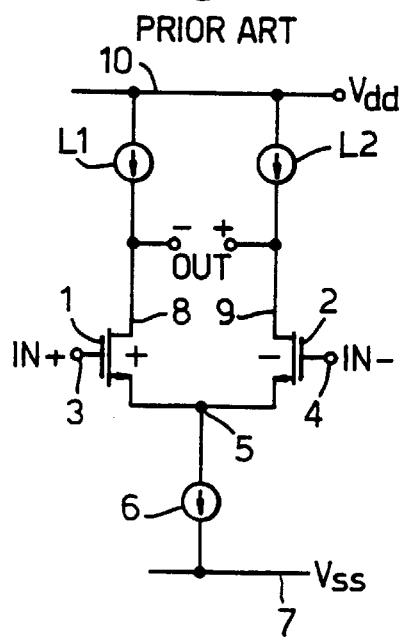
FIGS. 7–9 show known transistor amplifier input stages, having alternative transimpedance circuitry useful in understanding the present invention.
Figure 8:
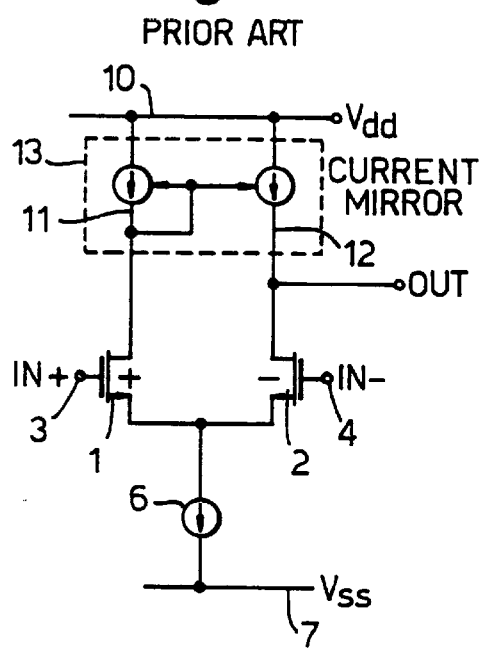
Figure 9:
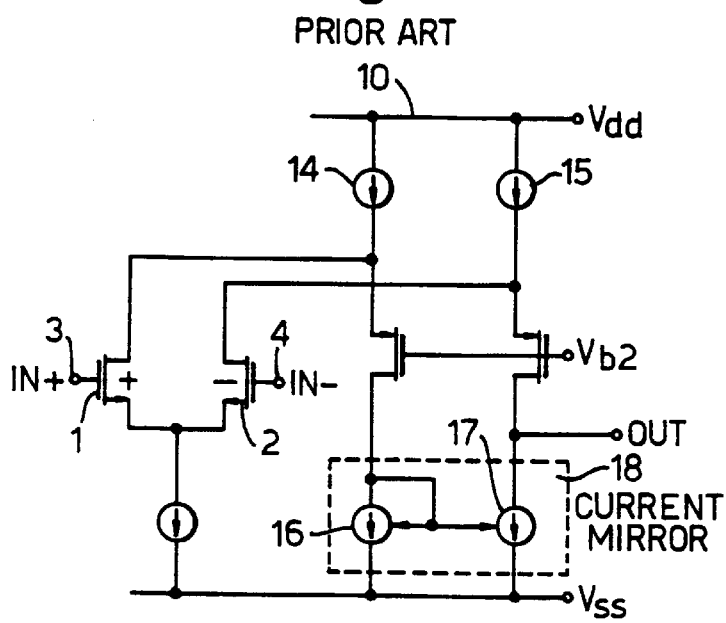

As discussed above with reference to FIG. 3, further circuitry as shown in FIGS. 6–9 may be used to supplement the input circuitry of FIG. 4 to provide a complete amplifier stage. An example of a complete gain stage, having transconductance circuitry as described with reference to FIG. 3, and transimpedance circuitry similar to that described with respect to FIG. 9, is shown in FIG. 5.

Figure 6:
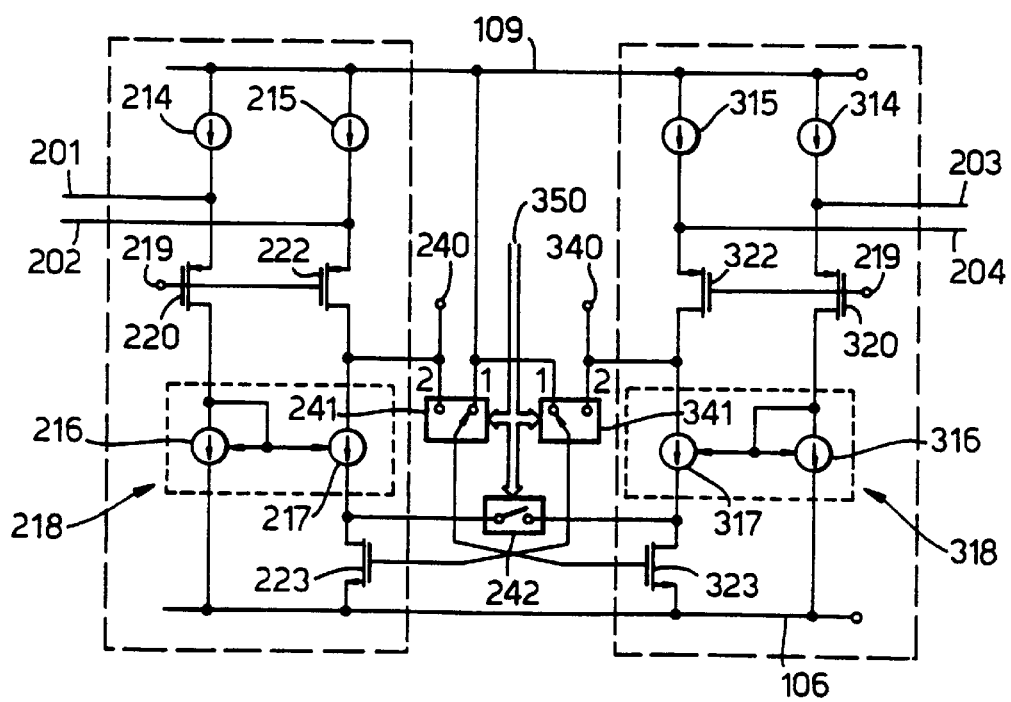
FIG. 6 shows another example of a transimpedance circuit usable with the embodiments of FIGS. 3 and 4.

Referring now to FIG. 6, another example of transimpedance circuitry useable with the transconductance circuitry of FIGS. 3 or 4 will now be described. The transimpedance circuitry has first and second inputs (201,202) for connection to the respective drains of first and second transistors (100,101) and third and fourth inputs for connection to the respective drains of the third and fourth transistors (102, 103), described with reference to FIG. 3 or FIG. 4.

The circuitry of FIG. 6 consists generally of four branches connected between a first supply potential (109) and a reference potential (106). The first circuit branch consists of the series connection of a current source (214) having one terminal connected to the above-mentioned supply potential (109), and another terminal connected to the first input terminal (201). The first input terminal (201) is connected to the source of a p-type field effect transistor (220), whose gate is connected to a bias potential input terminal (219). The drain of the p-FET (220) is connected to the control circuitry (216) of the current mirror circuitry (218), and the control circuitry (216) is connected at another terminal thereof to the above-mentioned reference potential (106). The second circuit branch has a second current source (215) connected at one terminal thereof to the supply potential (109), and at the other terminal thereof to the second input terminal (202). The second input terminal (202) is connected to the source of a second p-type field effect transistor (222), whose gate is connected to the bias potential input terminal (219). The drain of the second p-FET (222) is connected to the controlled circuitry (217) of current mirror circuitry (218), and the other terminal of the controlled circuitry (217) is connected to the drain of a first n-type field effect transistor (223), whose source is connected to the reference potential node (106).

The third branch of the circuit is similar to the first branch, and has a current source (314) connected serially between the third input (203) and the supply potential (109), the third input (203) being connected to the source of a third p-FET (320). The drain of the third p-FET (320) is connected via the controlling circuitry (316) of second current mirror circuitry (318) to the reference potential (106). The fourth branch of the circuit is similar to the above-described second branch, and has a series connection of a fifth current source (315) between the supply potential (109) and the fourth input terminal (204). The fourth input terminal (204) connects to the source of a fourth p-FET (322) whose drain is connected via the series connection of the controlled circuitry (317) of the second current mirror (318) and the drain-source path of a second n-FET (323). The gates of the third and fourth p-FETS (320,322) are commonly connected to the bias potential input terminal (219).

As shown in FIG. 6, the transimpedance circuitry further comprises a switching arrangement for controlling common-mode levels and this will now be described:

The drains of the second and fourth p-FETS (222,322) are connected to respective output terminals (240,340). First output terminal (240) is connected to a first input of first two-input switch circuitry (241), the second input of which is connected to the above-mentioned supply potential (109). The output of the first switch circuitry (241) is connected to the gate of the second n-FET (323). Similarly, second two-input switch circuitry (341) has a first input connected to the second output terminal (340), a second input connected to the supply potential terminal (109), and an output connected to the gate of the first n-FET (223). A third switching device (242) is connected between the drains of the first and second n-FETS (223,323).

The operation of the transimpedance circuitry of FIG. 6 will now be described:

The circuitry of FIG. 6 has two operating modes. In a first mode, the gates of first and second n-FETS (223,323) are connected via the respective switching circuitry to the supply potential terminal (109), whereby the first and second n-FETS each provide a low resistance connection between the controlled branches of the respective current mirrors (218,318) and the reference node (106). In a second mode, the output voltages are cross-coupled to the n-FET of the respective other branch, to provide common-mode compensation.

The inclusion of selection circuitry consisting of the first and second two-input switch circuitry (241,341) and the third switching device (242) provide switching between the two modes. Control of the selection circuitry is via a digital control signal input at a terminal (350), operable to simultaneously switch the elements of the selection circuitry.

In the first mode of operation, there is no interaction between the one half circuit comprising the first and second branches and the other half circuit comprising the third and fourth branches. The output of each half is therefore determined by the input currents to that half.

In the second mode of operation, the connecting switch (242) is closed so that the drain potentials of the first n-FET (223) and the second n-FET (323) are the same. The gate of first n-FET (223) is responsive to the output voltage at the second output terminal (340), and the gate potential of the second n-FET (323) is responsive to the output voltage at the first output terminal (240). The second mode allows a desired common-mode operating voltage to be established at the output of the circuit, which would otherwise have no intrinsic means of providing a determined common-mode output voltage.

In the second mode of operation the output stages no longer refer to the voltage on the reference node (106), but rather to the voltage at the drains of the first n-FET (223) and the second n-FET (323). The two n-FETs are operated in their linear region, such that there is an approximately linear relationship between the drain current and both the gate and drain voltages. This means that the potential on the drains is effectively connected to the reference potential (106) by two parallel resistors, whose values are linearly dependent on the gate voltages. Since the gate voltage of each n-FET is derived from the output of the opposite circuit half, the circuit, in the second mode of operation, has a self-compensating function. Thus, so long as the two outputs are complementary the combined resistances of the two n-FETs will not change and the drain potentials remain constant. However, if, for example, the output voltages both rise—i.e. if a common mode output change occurs—both resistors will reduce in value, lowering the common drain potential so that the output level returns to the correct,—i.e. common-mode compensated—output level.

Referring to FIG. 7, a known amplifier stage comprises a differential pair generally similar to one half of the tranconductance circuitry of FIGS. 3 and 4. The pair comprises two transistors (1,2) each having a gate electrode connected to a respective input terminal (3,4). The source electrodes of the transistors (1,2) are connected together at a node (5), and a current source (6) connects the node to a source of reference potential (7). For differential operation, the input voltages applied to the gate electrodes of the two transistors are exactly complementary.

The transistor drain electrodes (8,9) are connected to a source of supply potential (10) via respective loads (L1,L2) which constitute transimpedance circuitry for converting the respective currents of the pair into voltages. It will be understood that the transistors (8,9) each conduct a current dependent upon the respective drain voltage. A differential output voltage is derived between the drain electrodes by the current applied to the respective load. Each transistor of the differential pair operates in class-A.

The circuit has disadvantages in that the power supply rejection ratio of each transistor of the pair is low. Thus, as the supply potential varies, the drain voltage of the individual transistors will likewise vary. Hence, for example, noise in the power supply will appear in the voltage at the drain of each transistor, but would however be supressed if an output were taken differentially between the drains of the transistors.

Referring to FIG. 8, in a modification of the amplifier of FIG. 7 the drains of the two transistors (1,2) are instead coupled to the supply potential (10) via respective branches (11,12) of an output circuit (13) having a current mirror. So-called common mode input changes, where the input levels have a common, i.e. same sense variation with respect to the reference potential, are substantially cancelled in the single-ended output. As is known in the art, this circuit has a good power supply rejection ratio. The arrangement described with respect to FIG. 8 operates in class-AB.

In a further known amplifier circuit, shown in FIG. 9, two loads (14,15) provide current paths between the drains of the transconductive input transistors and the supply potential. Further current paths between the drains and the reference potential are provided via a series circuit of the channel of a respective transistor having a gate receiving a constant voltage (for common gate operation) and respective branches (16,17) of a current mirror (18). This common source-common gate arrangement provides folded-cascode operation, and thus has an improved input common-mode range. In this circuit, the loads, the common gate transistors and the current mirrors form transimpedance circuitry.

The arrangement of FIG. 9 operates in a manner generally analogous to FIG. 8.

I claim:

1. An amplifier circuit comprising a first and a second two-input differential input circuit, the first differential input circuit having first and second input terminals and the second differential input circuit having third and fourth input terminals, the first input terminal being connected to a first circuit input, the fourth input terminal being connected to a fourth circuit input, and programmable circuitry for selectively connecting the second and third input terminals either to second and third circuit inputs respectively, or to the fourth and first input terminals respectively.

2. An amplifier circuit comprising a first and a second two-input differential input circuit, the first differential input circuit having first and second input terminals and the second differential input circuit having third and fourth input terminals, the first input terminal being connected to a first circuit input, the fourth input terminal being connected to a fourth circuit input, and programmable circuitry for selectively connecting the second and third input terminals either to second and third circuit inputs respectively, or to the fourth and first circuit inputs respectively or both to a fifth circuit input.

3. An amplifier circuit according to claim 1 or claim 2 wherein the first differential input circuit comprises first and second amplifying elements, and the second differential input circuit comprises third and fourth amplifying elements, each said amplifying elements having a respective main current path and a control terminal connected to the respective input terminal.

4. An amplifier circuit according to claim 3 wherein each main current path is defined by a pair of main current electrodes, one main current electrode and a corresponding main current electrode of the second amplifying element forming a first node, and one main current electrode of the third amplifying element and the corresponding main current electrode of the fourth amplifying element forming a second node.

5. An amplifier circuit according to claim 4 further comprising connecting circuitry for selectively connecting the first and second nodes together.

6. An amplifier circuit according to claim 5 further comprising first bias circuitry providing a first current path between the first node and a reference potential and providing a second current path between the second node and the reference potential.

7. An amplifier circuit according to claim 3 further comprising first and second transimpedance circuitry, the first transimpedance circuitry being responsive to the currents in the main current paths of the first and second amplifying elements, and the second transimpedance circuitry being responsive to the currents in the main current paths of the third and fourth amplifying elements.

8. An amplifier circuit as claimed in claim 7 wherein the first and second transimpedance circuitry each comprise respective current mirror circuitry.

9. An amplifier circuit as claimed in claim 7 wherein the first and second transimpedance circuitry comprise folded cascode circuitry.

10. An amplifier circuit as claimed in claim 7 wherein the first and second transimpedance circuitry comprise respective first and second controllable offset circuitry and mode selection circuitry for selective connection of a control terminal of the controllable offset circuitry of one transimpedance circuitry to the output of the other transimpedance circuitry, whereby common mode output levels may be controlled.

11. An amplifier circuit according to claim 1 wherein the programmable circuitry has an input for a digital signal, whereby the connection of the control electrodes of the second and third amplifying elements is determined.

12. An amplifier circuit according to claim 1 wherein the programmable circuitry is one-time programmable, whereby the connection of the control electrodes of the second and third input amplifying elements is determined.

13. An amplifier circuit according to claim 1 wherein the first and fourth input terminals are inverting input terminals and the second and third input terminals are non-inverting input terminals.

14. A method of supplying inputs to an amplifier circuit having first and second two-input differential input circuits, wherein the first differential input circuit has first and second input terminals and the second differential input circuit has third and fourth input terminals, comprising:
    connecting a first circuit input to the first input terminal;
    connecting a fourth circuit input to the fourth input terminal; and
    selectively connecting the second and third input terminals either to second and third circuit inputs respectively, or to the fourth and first input terminals respectively.

15. An amplifier circuit according to claim 4 further comprising first bias circuitry providing a first current path between the first node and a reference potential and providing a second current path between the second node and the reference potential.

16. An amplifier circuit according to claim 4 further comprising first and second transimpedance circuitry, the first transimpedance circuitry being responsive to the currents in the main current paths of the first and second amplifying elements, and the second transimpedance circuitry being responsive to the currents in the main current paths of the third and fourth amplifying elements.

17. An amplifier circuit as claimed in claim 16 wherein the first and second transimpedance circuitry each comprise respective current mirror circuitry.

18. An amplifier circuit as claimed in claim 17 wherein the first and second transimpedance circuitry comprise folded cascode circuitry.

19. An amplifier circuit as claimed in claim 17 wherein the first and second transimpedance circuitry comprise respective first and second controllable offset circuitry and mode selection circuitry for selective connection of a control terminal of the controllable offset circuitry of one transimpedance circuitry to the output of the other transimpedance circuitry, whereby common mode output levels may be controlled.

20. An amplifier circuit according to claim 5 further comprising first and second transimpedance circuitry, the first transimpedance circuitry being responsive to the currents in the main current paths of the first and second amplifying elements, and the second transimpedance circuitry being responsive to the currents in the main current paths of the third and fourth amplifying elements.

21. An amplifier circuit as claimed in claim 20 wherein the first and second transimpedance circuitry each comprise respective current mirror circuitry.

22. An amplifier circuit as claimed in claim 21 wherein the first and second transimpedance circuitry comprise folded cascode circuitry.

23. An amplifier circuit as claimed in claim 21 wherein the first and second transimpedance circuitry comprise respective first and second controllable offset circuitry and mode selection circuitry for selective connection of a control terminal of the controllable offset circuitry of one transimpedance circuitry to the output of the other transimpedance circuitry, whereby common mode output levels may be controlled.

24. An amplifier circuit according to claim 6 further comprising first and second transimpedance circuitry, the first transimpedance circuitry being responsive to the currents in the main current paths of the first and second amplifying elements, and the second transimpedance circuitry being responsive to the currents in the main current paths of the third and fourth amplifying elements.

25. An amplifier circuit as claimed in claim 24 wherein the first and second transimpedance circuitry each comprise respective current mirror circuitry.

26. An amplifier circuit as claimed in claim 25 wherein the first and second transimpedance circuitry comprise folded cascode circuitry.

27. An amplifier circuit as claimed in claim 25 wherein the first and second transimpedance circuitry comprise respective first and second controllable offset circuitry and mode selection circuitry for selective connection of a control terminal of the controllable offset circuitry of one transimpedance circuitry to the output of the other transimpedance circuitry, whereby common mode output levels may be controlled.

28. An amplifier circuit as claimed in claim 8 wherein the first and second transimpedance circuitry comprise folded cascode circuitry.

29. An amplifier circuit according to claim 2 wherein the programmable circuitry has an input for a digital signal, whereby the connection of the control electrodes of the second and third amplifying elements is determined.

30. An amplifier circuit according to claim 2 wherein the programmable circuitry is one-time programmable, whereby the connection of the control electrodes of the second and third input amplifying elements is determined.

31. An amplifier circuit according to claim 2 wherein the first and fourth input terminals are inverting input terminals and the second and third input terminals are non-inverting input terminals.

* * * * *